United States Patent
Hsieh

(10) Patent No.: US 8,476,975 B2
(45) Date of Patent: Jul. 2, 2013

(54) OPERATIONAL AMPLIFYING DEVICE

(75) Inventor: Zong-Fu Hsieh, Tainan (TW)

(73) Assignee: Himax Technologies Limited, Tainan (TW)

(*) Notice: Subject to any disclaimer, the term of this patent is extended or adjusted under 35 U.S.C. 154(b) by 12 days.

(21) Appl. No.: 13/287,195

(22) Filed: Nov. 2, 2011

(65) Prior Publication Data

US 2013/0106521 A1    May 2, 2013

(51) Int. Cl.
*H03F 3/45* (2006.01)
*H03F 1/14* (2006.01)

(52) U.S. Cl.
USPC ............................................ 330/69; 330/292

(58) Field of Classification Search
USPC .............................. 330/69, 292; 345/204, 690
See application file for complete search history.

(56) References Cited

U.S. PATENT DOCUMENTS

| 7,535,467 | B2 * | 5/2009 | Kim et al. ...................... 345/204 |
| 8,232,931 | B2 * | 7/2012 | Wacyk et al. ................... 345/76 |
| 2010/0156944 | A1 * | 6/2010 | Haupt et al. ................... 345/690 |

* cited by examiner

*Primary Examiner* — Steven J Mottola
(74) *Attorney, Agent, or Firm* — McClure, Qualey & Rodack, LLP

(57) ABSTRACT

An operational amplifying device comprises an input stage and an output stage. The input stage receives and processes an input voltage to output an amplified voltage. The output stage is electrically connected to the input stage in series. The output stage comprises a first switch and a second switch. The first switch is configured to turn on for transferring the amplified voltage. The second switch is connected in parallel with the first switch and is configured to turn on for transferring the amplified voltage. The second switch is turned off when the first switch is turned on such that the amplified voltage is transferred through the first switch to the first resistor array for gamma correction.

7 Claims, 3 Drawing Sheets

OPERATIONAL AMPLIFYING DEVICE

BACKGROUND

1. Field of Invention

The embodiment of the present invention relates generally to basic electronic circuitry and, more particularly, to an operational amplifying device.

2. Description of Related Art

In the Gamma correction design, it is common to use an op-amp (operational amplifier) as a voltage follower connecting to different resistor arrays for different Gamma curve applications. Conventionally, a switch is placed following the op-amp output to switch to the different resistor arrays.

However, the switches placed outside the op-amp introduce a voltage drop (IR drop), and this voltage drop degrades the precision of the Gamma correction. In order to reduce the voltage drop, it is required to use large switches, but this results in a large area of occupation.

In order to solve the above problems, those skilled in the art are striving to find a solution, but no applicable method has yet been put forward. Therefore, there is a need to improve the voltage drop introduced by switches placed outside an op-amp and further improve the problem of large area occupation resulting from the use of large switches in an effort to reduce the voltage drop.

SUMMARY

An operational amplifying device is provided so as to improve the voltage drop introduced by switches placed outside an op-amp and further improve the problem of large area occupation resulting from the use of large switches in an effort to reduce the voltage drop.

Thus, one aspect of the embodiment of the present invention is to provide an operational amplifying device. The operational amplifying device comprises an input stage and an output stage. The input stage receives and processes an input voltage to output an amplified voltage. The output stage is electrically connected to the input stage in series. The output stage comprises a first switch, a first output buffer, a second switch, and a second output buffer. The first switch is configured to turn on for transferring the amplified voltage. The first output buffer is electrically connected in series with the first switch for receiving and processing the amplified voltage through the first switch such that the first output buffer outputs a first buffered voltage to a first resistor array.

Furthermore, the second switch and the second output buffer are connected in parallel with the first switch and first output buffer, and the second switch is configured to turn on for transferring the amplified voltage. The second output buffer is electrically connected in series with the second switch for receiving and processing the amplified voltage through the second switch such that the second output buffer outputs a second buffered voltage to a second resistor array. The second switch is turned off when the first switch is turned on such that the amplified voltage is transferred through the first switch and the first output buffer to the first resistor array for gamma correction.

In one embodiment of the present invention, each of the switches comprises a metal-oxide-semiconductor field effect transistor, a bipolar junction transistor, or an insulated gate bipolar transistor.

In still another embodiment of the present invention, the operational amplifying device further comprises a compensation capacitor. The compensation capacitor is electrically connected to the first switch and the first output buffer in parallel and connected to the second switch and the second output buffer in parallel for frequency compensation.

In yet another embodiment of the present invention, the output stage of the operational amplifying device further comprises at least one third switch and at least one third output buffer. The third switch is configured to turn on for transferring the amplified voltage. The third switch and the third output buffer are electrically connected in parallel with the second switch and the second output buffer. The third output buffer is electrically connected to the third switch in series for receiving and processing the amplified voltage through the third switch such that the third output buffer outputs a third buffered voltage to a third resistor array.

In yet another embodiment of the present invention, the input stage comprises an operational amplifying circuit. The operational amplifying circuit receives and processes the input voltage to output the amplified voltage.

In another aspect, the embodiment of the present invention provides an operational amplifying device. The operational amplifying device comprises an input stage and an output stage. The input stage comprises an input terminal and an output terminal. The output stage comprises a first switch, a first output buffer, a second switch, and a second output buffer. The first switch comprises a first terminal and a second terminal, and the first terminal of the first switch is electrically connected to the output terminal of the input stage. The first output buffer comprises an input terminal and an output terminal, and the input terminal of the first output buffer is electrically connected to the second terminal of the first switch.

Furthermore, the second switch and the second output buffer are connected in parallel with the first switch and the first output buffer. The second switch comprises a first terminal and a second terminal, and the first terminal of the second switch is electrically connected to the output terminal of the input stage. The second output buffer comprises an input terminal and an output terminal, and the input terminal of the second output buffer is electrically connected to the output terminal of the second switch.

In one embodiment of the present invention, each of the switches comprises a metal-oxide-semiconductor field effect transistor, a bipolar junction transistor, or an insulated gate bipolar transistor.

In still another embodiment of the present invention, the operational amplifying device further comprises a compensation capacitor. The compensation capacitor is electrically connected to the first switch and the first output buffer in parallel and connected to the second switch and the second output buffer in parallel for frequency compensation.

In yet another embodiment of the present invention, the operational amplifying device further comprises at least one third switch and at least one third output buffer. The third switch and the third output buffer are electrically connected in parallel with the second switch and the second output buffer. The third switch comprises a first terminal and a second terminal, and the first terminal of the third switch is electrically connected to the output terminal of the input stage.

In yet another embodiment of the present invention, the input stage further comprises an operational amplifying circuit. The operational amplifying circuit comprises an input terminal and an output terminal, and the first terminal of the first switch is electrically connected to the output terminal of operational amplifying circuit.

In summary, the operational amplifying device is provided so as to improve the voltage drop introduced by the switches placed outside the op-amp and further improve the problem of large area occupation resulting from the use of large switches in an effort to reduce the voltage drop.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
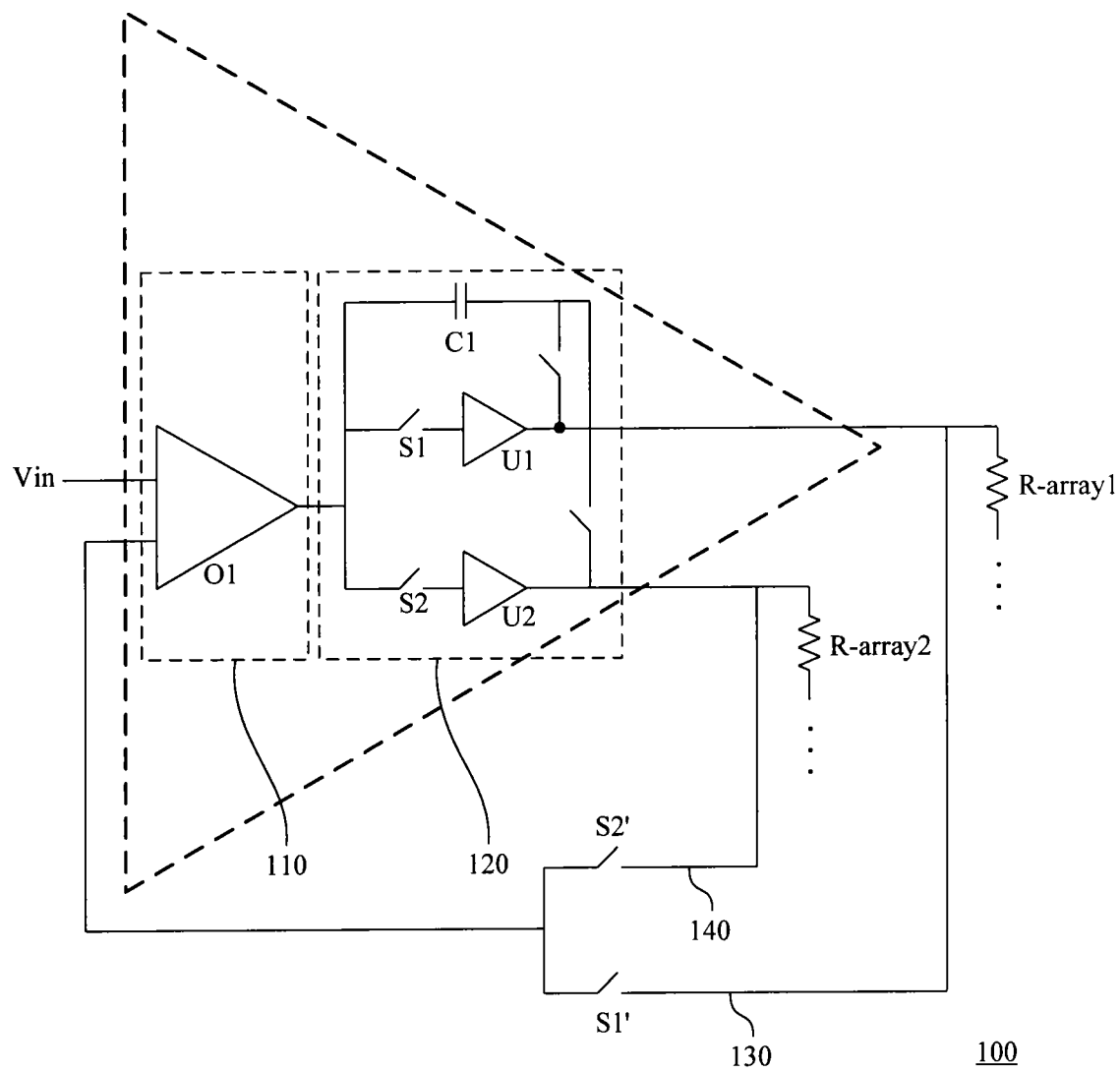
FIG. 1 shows schematically a circuit diagram of an operational amplifying device according to embodiments of the present invention.

The present disclosure is more particularly described in the following examples that are intended as illustrative only since numerous modifications and variations therein will be apparent to those skilled in the art. Various embodiments of the disclosure are now described in detail. Referring to the drawings, like numbers indicate like components throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. The use of examples anywhere in this specification, including examples of any terms discussed herein, is illustrative only, and in no way limits the scope and meaning of the disclosure or of any exemplified term. Likewise, the disclosure is not limited to various embodiments given in this specification.

As used herein, "around," "about" or "approximately" shall generally mean within 20 percent, preferably within 10 percent, and more preferably within 5 percent of a given value or range. Numerical quantities given herein are approximate, meaning that the term "around," "about" or "approximately" can be inferred if not expressly stated.

As used herein, the terms "comprising," "including," "having," "containing," "involving," and the like are to be understood to be open-ended, i.e., to mean including but not limited to.

FIG. 1 shows schematically a circuit diagram of an operational amplifying device 100 according to embodiments of the present invention. As shown in FIG. 1, the operational amplifying device 100 comprises an input stage 110 and an output stage 120. The input stage 110 receives and processes an input voltage Vin to output an amplified voltage to the output stage 120. The output stage 120 is electrically connected to the input stage 110 in series for receiving the amplified voltage. The output stage 120 comprises a first switch S1, a first output buffer U1, a second switch S2, and a second output buffer U2. The first switch S1 is configured to turn on for transferring the amplified voltage to the first output buffer U1. The first output buffer U1 is electrically connected in series with the first switch S1 for receiving and processing the amplified voltage through the first switch S1 such that the first output buffer U1 outputs a first buffered voltage to a first resistor array R-array 1.

Moreover, the second switch S2 and the second output buffer U2 are connected in parallel with the first switch S1 and the first output buffer U1. The second switch S2 is configured to turn on for transferring the amplified voltage to the second output buffer U2. The second output buffer U2 is electrically connected in series with the second switch S2 for receiving and processing the amplified voltage through the second switch S2 such that the second output buffer U2 outputs a second buffered voltage to a second resistor array R-array 2.

The second switch S2 is turned off when the first switch S1 is turned on such that the amplified voltage is transferred through the first switch S1 and the first output buffer U1 to the first resistor array R-array 1 for gamma correction. On the other hand, the first switch S1 is turned off when the second switch S2 is turned on such that the amplified voltage is transferred through the second switch S2 and the second output buffer U2 to the second resistor array R-array 2 for gamma correction. Furthermore, each of the switches comprises a metal-oxide-semiconductor field effect transistor, a bipolar junction transistor, or an insulated gate bipolar transistor.

The switches can be disposed in the operational amplifying device, and in the case where the switches are metal-oxide-semiconductor field effect transistors. The switch S1/S2 bridges the input stage 110 and the output stage 120 of the operational amplifying device 100. By the switches, the output terminal of the input stage 110 is coupled to the input terminal or the gate terminal of the output stage 120. Therefore, there is no current generated in the switches, so there is no voltage drop in the switches, and further, there is no need to use large switches in the operational amplifying device in an effort to reduce the voltage drop so that the size of the switches can be decreased.

In an optional embodiment of the present invention, the operational amplifying device 100 further comprises a compensation capacitor C1. The compensation capacitor C1 is electrically connected to the first switch S1 and the first output buffer U1 in parallel and connected to the second switch S2 and the second output buffer U2 in parallel for frequency compensation.

In one embodiment of the present invention, the operational amplifying device 100 further comprises a first feedback loop 130 and a second feedback loop 140. The first feedback loop 130 comprises a first feedback switch S1'. The first feedback switch S1' is turned on corresponding to the turned-on duration of the first switch S1; meanwhile, the first feedback loop 130 feeds back the amplified voltage to the operational amplifying circuit O1. In addition, the second feedback loop 140 comprises a second feedback switch S2'. The second feedback switch S2' is turned on corresponding to the turned-on duration of the second switch S2; meanwhile, the second feedback loop 140 feeds back the amplified voltage to the operational amplifying circuit O1.

Figure 2:
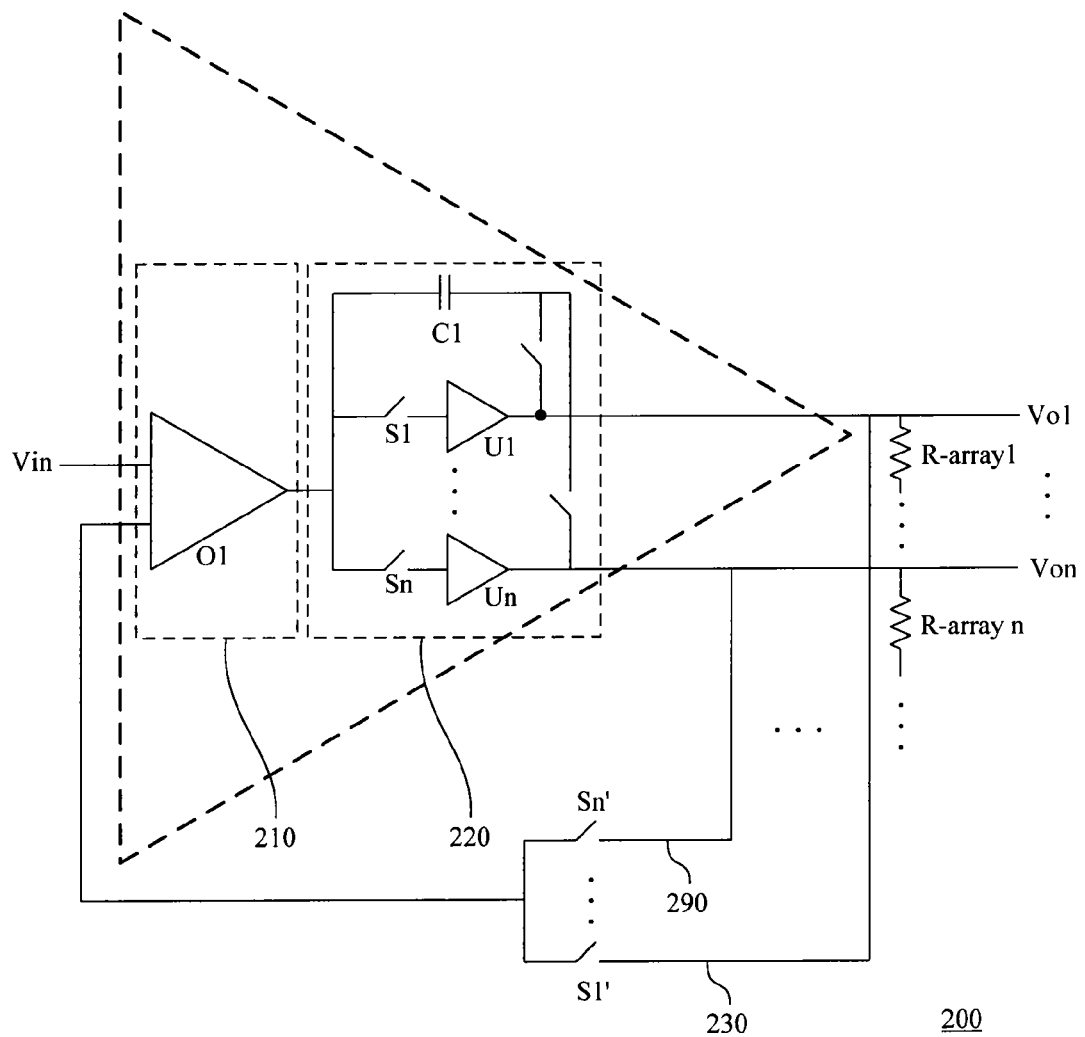
FIG. 2 shows schematically a circuit diagram of an operational amplifying device according to embodiments of the present invention.

FIG. 2 shows schematically a circuit diagram of an operational amplifying device 200 according to embodiments of the present invention. Compared with the operational amplifying device 100 as shown in FIG. 1, the operational amplifying device 200 herein further comprises at least one third switch Sn and at least one third output buffer Un. The third switch Sn and the third output buffer Un are electrically connected in parallel with the second switch S2 and the second output buffer U2. The third switch Sn is configured to turn on for transferring the amplified voltage to the third output buffer Un. The third output buffer Un is electrically connected to the third switch Sn in series for receiving and processing the amplified voltage through the third switch S3 such that the third output buffer U3 outputs a third buffered voltage to a third resistor array R-array n.

For example, the operational amplifying device 200 with 5-bit switches and output buffers may have thirty-two switches and output buffers, and one of the switches may be turned on for transferring the amplified voltage to a corresponding resistor array based on actual requirements. In this case, the number of the third switches of the embodiment of the present invention can be 32. However, the present invention is not limited in this regard, and those skilled in the art can selectively adopt a suitable number of the switches and output buffers according to actual requirements.

In one embodiment of the present invention, compared with the operational amplifying device 100 as shown in FIG. 1, the operational amplifying device 200 herein further comprises at least one third feedback loop 290. The third feedback loop 290 comprises at least one third feedback switch Sn'. The third feedback switch Sn' is turned on corresponding to the turned-on duration of the third switch Sn; meanwhile, the third feedback loop 290 feeds back the amplified voltage to the operational amplifying circuit O1.

Reference is now made to both FIG. 1 and FIG. 2. The input stage 110 comprises an operational amplifying circuit O1 for receiving and processing the input voltage to output the amplified voltage.

It is noted that the remaining electrical elements of the operational amplifying device 200 as shown in FIG. 2 have been described hereinabove in connection with FIG. 1, and accordingly, a detailed description with respect to these other electrical elements is omitted herein for the sake of brevity.

In another aspect, the operational amplifying device 100 as shown in FIG. 1 comprises an input stage 110 and an output stage 120. The input stage 110 comprises an input terminal and an output terminal. The output stage 120 comprises a first switch S1, a first output buffer U1, a second switch S2, and a second output buffer U2. The first switch S1 comprises a first terminal and a second terminal. The first terminal of the first switch is electrically connected to the output terminal of the input stage 110. The first output buffer U1 comprises an input terminal and an output terminal, and the input terminal of the first output buffer U1 is electrically connected to the second terminal of the first switch S1, and the second terminal of the first output buffer U1 is electrically connected to the first resistor array R-array 1.

Moreover, the second switch S2 and the second output buffer U2 are connected in parallel with the first switch S1 and the first output buffer U1. The second switch S2 comprises a first terminal and a second terminal. The first terminal of the second switch S2 is electrically connected to the output terminal of the input stage 110. The second output buffer U2 comprises an input terminal and an output terminal, and the input terminal of the second output buffer U2 is electrically connected to the output terminal of the second switch S2, and the second terminal of the second output buffer U2 is electrically connected to the second resistor array R-array 2.

In one embodiment of the present invention, each of the switches comprises a metal-oxide-semiconductor field effect transistor, a bipolar junction transistor, or an insulated gate bipolar transistor.

The switches can be disposed in the operational amplifying device, and in the case where the switches are metal-oxide-semiconductor field effect transistors. The switch S1/S2 bridges the input stage 110 and the output stage 120 of the operational amplifying device 100. By the switches, the output terminal of the input stage 110 is coupled to the input terminal or the gate terminal of the output stage 120. Therefore, there is no current generated in the switches, so there is no voltage drop in the switches, and further, there is no need to use large switches in the operational amplifying device in an effort to reduce the voltage drop so that the size of the switches can be decreased.

In still another embodiment of the present invention, the operational amplifying device 100 further comprises a compensation capacitor C1. The compensation capacitor C1 is electrically connected to the first switch S1 and the first output buffer U1 in parallel and connected to the second switch S2 and the second output buffer U2 in parallel for frequency compensation.

Reference is now made to FIG. 2. Compared with the operational amplifying device 100 as shown in FIG. 1, the operational amplifying device 200 herein further comprises at least one third switch Sn and at least one third output buffer Un. The third switch Sn and the third output buffer Un are electrically connected in parallel with the second switch S2 and second output buffer U2. The third switch Sn comprises a first terminal and a second terminal, and the first terminal of the third switch Sn is electrically connected to the output terminal of the input stage 210. The third output buffer Un comprises an input terminal and an output terminal, and the input terminal of the third output buffer Un is electrically connected to the second terminal of the third switch Sn.

For example, the operational amplifying device 200 with 5-bit switches and output buffers may have thirty-two switches and output buffers, and one of the switches may be turned on for transferring the amplified voltage to a corresponding resistor array based on actual requirements. In this case, the number of the third switches of the embodiment of the present invention can be 32. However, the present invention is not limited in this regard, and those skilled in the art can selectively adopt a suitable number of the switches and output buffers according to actual requirements.

Reference is now made to both FIG. 1 and FIG. 2. The input stage comprises an operational amplifying circuit O1. The operational amplifying circuit comprises an input terminal and an output terminal, and the first terminal of the first switch is electrically connected to the output terminal of operational amplifying circuit O1.

Figure 3:
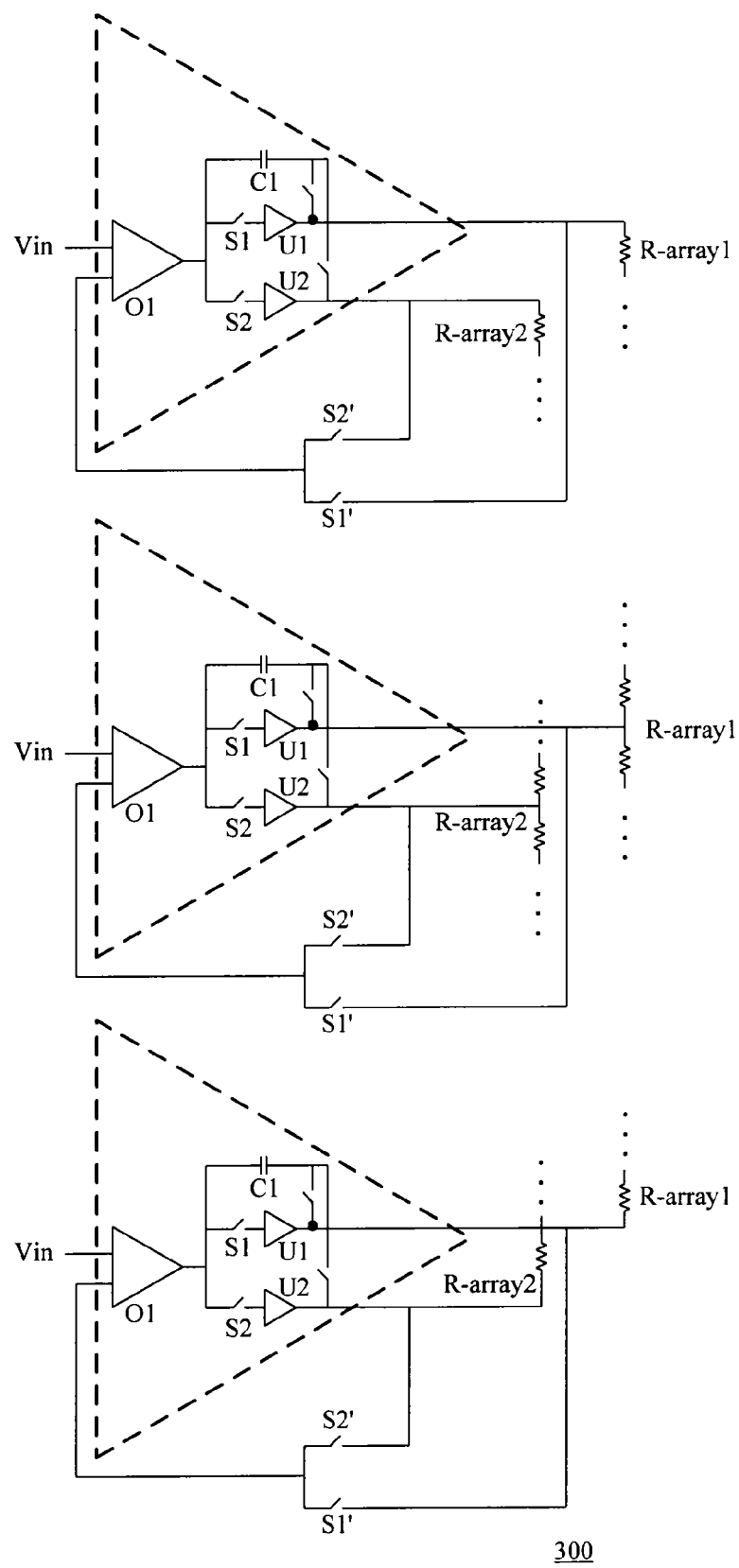
FIG. 3 shows schematically a circuit diagram of a gamma correction device according to embodiments of the present invention.

FIG. 3 shows schematically a circuit diagram of a gamma correction device 300 according to embodiments of the present invention. The gamma correction device 300 comprises three operational amplifying devices 100. In this configuration, the switch S1/S2 is disposed in the operational amplifying device 100, and the switch S1/S2 bridges the input stage 110 and the output stage 120 of the operational amplifying device 100. By the switches, the output terminal of the input stage 110 is coupled to the input terminal or the gate terminal of the output stage 120. Therefore, there is no current generated in the switches, so there is no voltage drop in the switches, and further, there is no need to use large switches in the operational amplifying device in an effort to reduce the voltage drop so that the size of the switches can be decreased.

In view of the foregoing embodiments of the present invention, many advantages of the present invention are now apparent. The embodiments of the present invention provide the operational amplifying device so as to improve the voltage drop introduced by the switches placed outside the op-amp and further improve the problem of large area occupation resulting from the use of large switches in an effort to reduce the voltage drop.

It will be understood that the above description of embodiments is given by way of example only and that various modifications may be made by those with ordinary skill in the art. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of this invention, and the scope thereof is determined by the claims that follow.

What is claimed is:

1. An operational amplifying device comprising:
   an input stage for receiving and processing an input voltage to output an amplified voltage; and
   an output stage electrically connected to the input stage in series, wherein the output stage comprises:
   a first switch configured to turn on for transferring the amplified voltage;
   a first output buffer electrically connected in series with the first switch for receiving and processing the amplified voltage through the first switch such that the first output buffer outputs a first buffered voltage to a first resistor array;
   a second switch configured to turn on for transferring the amplified voltage; and
   a second output buffer, wherein the second switch and the second output buffer are connected in parallel with the first switch and the first output buffer, wherein the second output buffer is electrically connected in series with the second switch for receiving and processing the amplified voltage through the second switch such that the second output buffer outputs a second buffered voltage to a second resistor array;
   wherein the second switch is turned off when the first switch is turned on such that the amplified voltage is transferred through the first switch and the first output buffer to the first resistor array for gamma correction.

2. The operational amplifying device according to claim 1, wherein each of the switches comprises a metal-oxide-semiconductor field effect transistor, a bipolar junction transistor, or an insulated gate bipolar transistor.

3. The operational amplifying device according to claim 1, wherein the output stage further comprising:
   a compensation capacitor electrically connected to the first switch and the first output buffer in parallel and connected to the second switch and the second output buffer in parallel for frequency compensation.

4. The operational amplifying device according to claim 1, wherein the input stage comprises an operational amplifying circuit for receiving and processing the input voltage to output the amplified voltage.

5. An operational amplifying device comprising:
   an input stage comprising an input terminal and an output terminal; and
   an output stage comprising:
   a first switch comprising a first terminal and a second terminal, wherein the first terminal of the first switch is electrically connected to the output terminal of the input stage;
   a first output buffer comprising an input terminal and an output terminal, wherein the input terminal of the first output buffer is electrically connected to the second terminal of the first switch;
   a second switch comprises a first terminal and a second terminal, and the first terminal of the second switch is electrically connected to the output terminal of the input stage;
   a second output buffer, wherein the second switch and the second output buffer are connected in parallel with the first switch and the first output buffer, wherein the second output buffer comprising an input terminal and an output terminal, and the input terminal of the second output buffer is electrically connected to the output terminal of the second switch; and
   a compensation capacitor electrically connected to the first switch and the first output buffer in parallel and connected to the second switch and the second output buffer in parallel for frequency compensation.

6. The operational amplifying device according to claim 5, wherein each of the switches comprises a metal-oxide-semiconductor field effect transistor, a bipolar junction transistor, or an insulated gate bipolar transistor.

7. The operational amplifying device according to claim 5, wherein the input stage further comprises an operational amplifying circuit, the operational amplifying circuit comprises an input terminal and an output terminal, and the first terminal of the first switch is electrically connected to the output terminal of operational amplifying circuit.

* * * * *